(12) United States Patent
Qin et al.

(10) Patent No.: US 9,701,541 B2
(45) Date of Patent: Jul. 11, 2017

(54) METHODS AND SYSTEMS FOR STABILIZING FILAMENTS IN A CHEMICAL VAPOR DEPOSITION REACTOR

(71) Applicant: GTAT Corporation, Merrimack, NH (US)

(72) Inventors: Wenjun Qin, Missoula, MT (US); Chad Fero, Missoula, MT (US); Aaron Dean Rhodes, Missoula, MT (US); Jeffrey C. Gum, Stevensville, MT (US)

( * ) Notice: Subject to any disclaimer, the term of this patent is extended or adjusted under 35 U.S.C. 154(b) by 503 days.

(21) Appl. No.: 13/720,133

(22) Filed: Dec. 19, 2012

(65) Prior Publication Data

US 2014/0170337 A1    Jun. 19, 2014

(51) Int. Cl.
| | |
|---|---|
| *C23C 16/50* | (2006.01) |
| *C23C 16/00* | (2006.01) |
| *C23F 1/00* | (2006.01) |
| *H01L 21/306* | (2006.01) |
| *C01B 33/035* | (2006.01) |
| *C23C 16/24* | (2006.01) |
| *C23C 16/44* | (2006.01) |

(52) U.S. Cl.
CPC ............ *C01B 33/035* (2013.01); *C23C 16/24* (2013.01); *C23C 16/4418* (2013.01)

(58) Field of Classification Search
USPC .................. 118/728–732; 156/345.51–345.55
See application file for complete search history.

(56) References Cited

U.S. PATENT DOCUMENTS

| | | | | |
|---|---|---|---|---|
| 2007/0251447 A1* | 11/2007 | Muller | .................. | C01B 33/035 118/620 |
| 2009/0130333 A1* | 5/2009 | Kim et al. | .................... | 427/545 |
| 2009/0165704 A1* | 7/2009 | Tebakari | ............... | C01B 33/035 117/101 |
| 2009/0241838 A1* | 10/2009 | Endoh | ................... | C01B 33/035 118/725 |
| 2010/0041215 A1* | 2/2010 | Kim | ...................... | C01B 33/035 438/488 |

(Continued)

FOREIGN PATENT DOCUMENTS

JP          56105622          8/1981

OTHER PUBLICATIONS

PCT Search Report dated Mar. 21, 2014 of Patent Application No. PCT/US2013/076529 filed Dec. 19, 2013.

(Continued)

*Primary Examiner* — Karla Moore
*Assistant Examiner* — Tiffany Nuckols
(74) *Attorney, Agent, or Firm* — McDonnell Boehnen Hulbert & Berghoff LLP

(57) ABSTRACT

In various embodiments, systems, methods, and apparatus are provided for stabilizing filaments in a chemical vapor deposition (CVD) reactor system. A system includes a base plate having a plurality of electrical connections, a pair of filaments extending from the base plate, and a stabilizer connecting the pair of filaments. Each filament is in electrical contact with, and defines a conductive path between, the two electrical connections. A method of stabilizing the filaments includes providing the pair of filaments, and connecting the pair of filaments with at least one stabilizer. The stabilizer may include an electrically insulating material.

14 Claims, 7 Drawing Sheets

(56) References Cited

U.S. PATENT DOCUMENTS

2011/0220283 A1* 9/2011 Nagaura ............... C01B 33/035
156/296
2011/0305604 A1* 12/2011 Stocklinger ............. B01J 15/00
422/200

OTHER PUBLICATIONS

Chinese Office Action for Appl No. 201380072800.8 dated Sep. 28, 2016, 12 pages.

* cited by examiner

METHODS AND SYSTEMS FOR STABILIZING FILAMENTS IN A CHEMICAL VAPOR DEPOSITION REACTOR

TECHNICAL FIELD

In various embodiments, the invention relates to chemical vapor deposition (CVD), and more particularly, to methods and systems for stabilizing filaments in a CVD reactor for the production of polysilicon.

BACKGROUND

CVD is a chemical process used to produce high-purity, high-performance solid materials. The process is often used in the semiconductor and photovoltaic industries to produce high quality silicon materials. In a conventional CVD process, a filament or rod structure is exposed to one or more volatile precursors that react and/or decompose on the filament surface to produce the desired deposit. Frequently, volatile byproducts are also produced, which can be removed by gas flow through the reaction chamber of the CVD reactor.

One method used to produce solid materials such as polysilicon in a CVD reactor is the Siemens method, in which polysilicon is deposited on thin silicon filaments. Because the filaments are fabricated from high-purity silicon, the electrical resistance of the filaments during a reactor startup phase is extremely high. Unless the filaments are doped with an electrically active element, the high electrical resistance makes it difficult to heat the filaments using electrical current during the startup phase.

To accelerate the heating process during startup, a high voltage, on the order of thousands of volts, may be applied to the filaments. This causes a small electrical current to flow through the filaments, which generates heat in the filaments. As the filaments heat up, the electrical resistance of the filaments is reduced, which permits yet higher current flow and additional heat to be generated by the filaments. When the filaments reach the desired temperature, typically greater than 800° C., the voltage may be reduced so that further temperature increases do not occur.

In some instances, due to vibration, loose connections, forces associated with fluid flow inside the reactor, and/or other causes (e.g., the weight of deposited materials), a filament in a CVD reactor may tilt or tip over and come into contact with the reactor wall or another filament in the reactor. Such contact generally causes a ground fault in the reactor, resulting in termination of the CVD process, and costly downtime. Although there are cost and production advantages to using tall and thin filaments, such filaments are more likely to tip over, often due to breakage of the filament (e.g., near the base plate, at a chuck-to-filament connection). Further, as polysilicon is deposited on the filaments, the added weight of the polysilicon puts stress on the filaments and increases the likelihood that the filaments may break and/or tip over.

There is a need for methods, systems, and apparatus for stabilizing filaments in a CVD reactor to prevent ground faults and unnecessary stoppages of CVD processes.

SUMMARY OF THE INVENTION

Embodiments of the present invention provide a CVD reactor having a pair of filaments that are connected with a stabilizer. The stabilizer preferably is or includes an electrically insulating material to prevent the flow of electricity through the stabilizer during the CVD process, which often occurs at high temperatures (e.g., 1000° C.). By using the stabilizer, the tendency for filaments to tip over and cause ground faults is greatly reduced. Embodiments of the invention may be used in any CVD process in which filaments are utilized, including CVD processes for the production of polysilicon.

In one aspect, the invention relates to a chemical vapor deposition reactor system. The system includes a base plate having a plurality of electrical connections, a pair of filaments extending from the base plate, and a stabilizer connecting the pair of filaments. Each filament is in electrical contact with two of the electrical connections and defines a conductive path between the two electrical connections.

In certain embodiments, the stabilizer includes an electrically insulating material (e.g., quartz and/or silicon nitride). For example, the stabilizer may include at least one electrically insulating connector. The stabilizer may also include at least one support rod, which may include or consist of, for example, silicon. In some embodiments, the electrically insulating connector includes at least one socket for receiving the at least one support rod. The stabilizer may include, for example, two outer support rods joined by a central electrically insulating connector. At least one of the outer support rods may include or consist of silicon. The central electrically insulating connector may include quartz and/or silicon nitride. In one embodiment, the stabilizer is adjustable in length.

In certain embodiments, each filament includes: (i) two vertical filament segments, each vertical segment having a proximal end in electrical contact with one of the electrical connections, and a distal end, and (ii) a bridge connecting the two vertical filament segments at the distal end. The stabilizer may be connected to at least one of the filaments near the distal end of one of the vertical filament segments. In some embodiments, the stabilizer is connected to at least one of the filaments at the bridge. A stabilizer angle between the stabilizer and the bridge may be, for example, from about 20 degrees to about 160 degrees, e.g., from about 80 degrees to about 100 degrees. In one embodiment, each filament is substantially U-shaped. The stabilizer and the pair of filaments may be arranged within a ring and/or a partial ring, which may include, for example, more than two filaments and more than one stabilizer. In some embodiments, the system includes a second pair of filaments and a second stabilizer connecting the second pair of filaments, the pair of filaments being configured to operate at a first electrical phase, and the second pair of filaments being configured to operate at a second electrical phase.

In another aspect, the invention relates to a method of stabilizing filaments in a chemical vapor deposition reactor. The method includes the steps of providing a pair of filaments extending from a base plate in the chemical vapor deposition reactor, and connecting the pair of filaments with at least one stabilizer. The base plate includes a plurality of electrical connections. Each filament is in electrical contact with two of the electrical connections and defines a conductive path between the two electrical connections. The description of elements of the embodiments above can be applied to this aspect of the invention as well.

In certain embodiments, the stabilizer includes an electrically insulating material (e.g., quartz or silicon nitride). For example, stabilizer may include at least one electrically insulating connector. The stabilizer may also include at least one support rod, which may include or consist of, for example, silicon. In some embodiments, the electrically insulating connector includes at least one socket for receiving the at least one support rod. The stabilizer may include, for example, two outer support rods joined by a central electrically insulating connector. At least one of the outer support rods may include or consist of silicon. The central electrically insulating connector may include quartz and/or silicon nitride. In one embodiment, the stabilizer is adjustable in length.

In certain embodiments, each filament includes: (i) two vertical filament segments, each vertical segment having a proximal end in electrical contact with one of the electrical connections, and a distal end, and (ii) a bridge connecting the two vertical filament segments at the distal end. The stabilizer may be connected to at least one of the filaments near the distal end of one of the vertical filament segments. In some embodiments, the stabilizer is connected to at least one of the filaments at the bridge. A stabilizer angle between the stabilizer and the bridge may be, for example, from about 20 degrees to about 160 degrees, e.g., from about 80 degrees to about 100 degrees. In one embodiment, each filament is substantially U-shaped.

In another aspect, the invention relates to a method of performing chemical vapor deposition in a chemical vapor deposition reactor. The method includes passing electrical current through a pair of filaments in the chemical vapor deposition reactor, and depositing polysilicon on the pair of filaments. The filaments extend from a base plate in the reactor, wherein the base plate includes a plurality of electrical connections. Each filament is in electrical contact with two of the electrical connections and defines a conductive path between the two electrical connections. The two filaments are connected with a stabilizer. The description of elements of the embodiments above can be applied to this aspect of the invention as well.

In certain embodiments, the stabilizer includes an electrically insulating material (e.g., quartz or silicon nitride). For example, the stabilizer may include at least one electrically insulating connector. The stabilizer may also include at least one support rod, which may include or consist of, for example, silicon. In some embodiments, the electrically insulating connector includes at least one socket for receiving the at least one support rod. The stabilizer may include, for example, two outer support rods joined by a central electrically insulating connector. At least one of the outer support rods may include or consist of silicon. The central electrically insulating connector may include quartz and/or silicon nitride. In one embodiment, the stabilizer is adjustable in length.

In certain embodiments, each filament includes: (i) two vertical filament segments, each vertical segment having a proximal end in electrical contact with one of the electrical connections, and a distal end, and (ii) a bridge connecting the two vertical filament segments at the distal end. The stabilizer may be connected to at least one of the filaments near the distal end of one of the vertical filament segments. In some embodiments, the stabilizer is connected to at least one of the filaments at the bridge. The stabilizer may be substantially orthogonal to the bridge of at least one of the filaments. In one embodiment, each filament is substantially U-shaped.

Elements of embodiments described with respect to a given aspect of the invention may be used in various embodiments of another aspect of the invention. For example, it is contemplated that features of dependent claims depending from one independent claim can be used in systems and/or methods of any of the other independent claims.

BRIEF DESCRIPTION OF THE DRAWINGS

The objects and features of the invention can be better understood with reference to the drawings described below, and the claims.

DESCRIPTION

Figure 1:
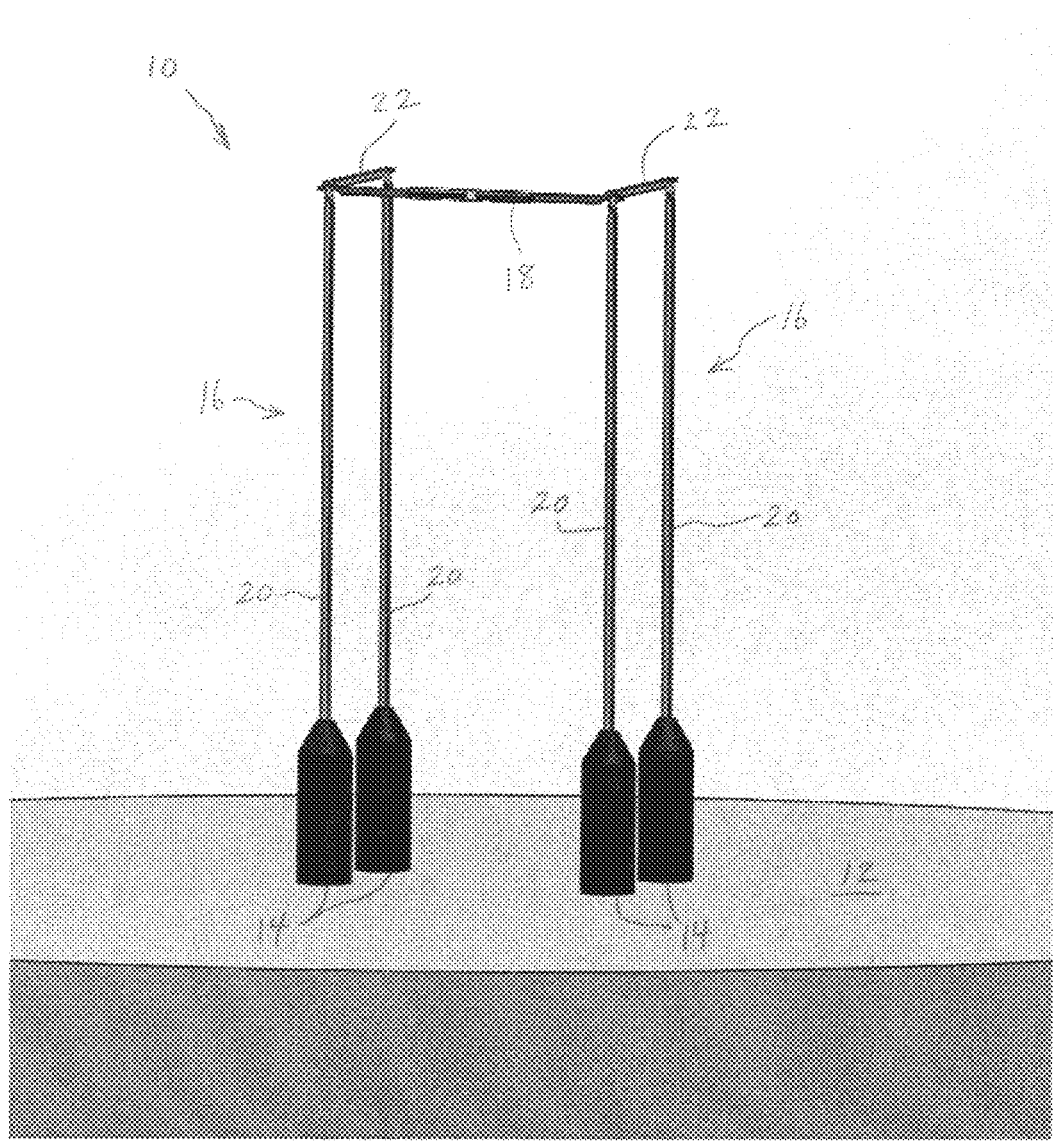
FIG. 1 is a schematic perspective view of a pair of filaments connected with a stabilizer, according to an illustrative embodiment of the invention.

It is contemplated that apparatus, systems, methods, and processes of the claimed invention encompass variations and adaptations developed using information from the embodiments described herein. Adaptation and/or modification of the apparatus, systems, methods, and processes described herein may be performed by those of ordinary skill in the relevant art.

Throughout the description, where apparatus and systems are described as having, including, or comprising specific components, or where processes and methods are described as having, including, or comprising specific steps, it is contemplated that, additionally, there are apparatus and systems of the present invention that consist essentially of, or consist of, the recited components, and that there are processes and methods according to the present invention that consist essentially of, or consist of, the recited processing steps.

It should be understood that the order of steps or order for performing certain actions is immaterial so long as the invention remains operable. Moreover, two or more steps or actions may be conducted simultaneously.

The mention herein of any publication, for example, in the Background section, is not an admission that the publication serves as prior art with respect to any of the claims presented herein. The Background section is presented for purposes of clarity and is not meant as a description of prior art with respect to any claim.

In certain embodiments, an "electrically insulating material" is a material having an electrical resistivity that is greater than the electrical resistivity of material(s) (e.g., silicon) being deposited in a corresponding CVD process. For example, the electrically insulating material may have an electrical resistivity greater than 1.0 ohm-meters at temperatures less than 1500° C. Examples of electrically insulating materials include, e.g., quartz and silicon nitride.

In general, a CVD reactor may include a bell jar disposed over a base plate having electrical connections or feedthroughs, a gas inlet, and a gas outlet. A viewing port may be included to permit visual inspection of the interior of the reactor. A filament structure in the reactor may include, for example, two vertical filament segments connected by a horizontal bridge. During a CVD process, a solid material such as polysilicon may be deposited onto the filament structure. An exemplary CVD reactor is GT Advanced Technologies' SDR™-400. CVD reactor systems are described in U.S. Patent Application Publication No. 2011/0203101, by Gum et al., titled "Chuck and Bridge Connection Points for Tube Filaments in a Chemical Vapor Deposition Reactor," filed Jun. 23, 2009, the entire disclosure of which is incorporated by reference herein in its entirety.

As mentioned above, during operation of a CVD reactor (e.g., for the production of polysilicon), one or more filaments within the reactor may tilt or tip over, causing a ground fault. In general, ground faults result in unnecessary stoppages of CVD processes and costly downtime. Various embodiments of the invention prevent ground faults by stabilizing the filaments so that they do not tip over.

Referring to FIG. 1, in certain embodiments, a CVD reactor 10 includes a base plate 12, a plurality of filament supports or chucks 14, a pair of filaments 16, and a stabilizer 18. The chucks 14 are disposed on or within the base plate 12 and support each of the filaments 16. Each filament 16 includes two vertical filament segments 20 connected by a bridge 22. A proximal end of each vertical filament segment 20 is inserted into an opening within one of the chucks 14. The chucks 14 physically support the vertical filament segments 20 and generally include electrical connections to apply a voltage across each filament 16. The stabilizer 18 connects the two filaments 16 at a distal (i.e., top) end of the filaments 16. In some embodiments, the stabilizer 18 is connected to the filaments at a location other than the distal end. Further, the pair of filaments 16 may be connected by more than one stabilizer 18, for example, to improve filament stability. To prevent the flow of electricity between the two filaments 16, the stabilizer 18 preferably includes an electrically insulating material.

The filaments 16 may include any suitable material that provides the desired structural, thermal, chemical, and electrical properties for the CVD process. In one example, the filaments 16 are made of the same material that is formed and deposited during the CVD process. For the production of polysilicon, for example, the filaments 16 may include or consist essentially of silicon, to avoid contaminating the polysilicon with other materials.

In general, the filaments 16 may have any shape. For example, the filaments 16 may be substantially U-shaped (also referred to as hairpin shaped), as depicted in FIG. 1. The U-shaped filaments 16 may have square corners, as depicted, where the bridge 22 is connected to the vertical filament segments 20. Alternatively, the corners of the filaments 16 may be rounded. In some instances, the filaments 16 are substantially triangular, rectangular, semicircular, U-shaped, or combinations thereof. A length of the vertical filament segments 20 may be equal to or greater than about 1 meter, preferably from about 1 meter to about 5 meters, or more preferably from about 1 meter to about 3 meters, e.g., about 2 meters. A length of the bridge may be, for example, equal to or greater than about 0.1 meters, or preferably from about 0.1 meters to about 0.5 meters. Likewise, a length of the stabilizer 18 may be, for example, equal to or greater than about 0.1 meters, or preferably from about 0.1 meters to about 0.5 meters. Minimum, maximum, and typical values for the dimensions of the stabilizer 18, the vertical filament segments 20, and the bridge 22 are provided in Table 1.

TABLE 1

Exemplary system dimensions.

| Dimension | Min. | Typical | Max. |
| --- | --- | --- | --- |
| Length of vertical filament segments (m) | 1 | 2 | 5 |
| Length of bridge (m) | 0.1 | 0.3 | 0.5 |
| Length of stabilizer (m) | 0.1 | 0.3 | 0.5 |
| Initial cross-dimension of vertical filament segments (cm) | 0.4 | 0.7 | 2 |
| Initial cross-dimension of bridge (cm) | 0.4 | 0.7 | 2 |
| Initial cross-dimension of stabilizer (cm) | 0.4 | 0.7 | 2 |

Each of the stabilizer 18, the vertical filament segments 20, and the bridge 22 may have any cross-sectional shape. For example, the vertical filament segments 20, the bridge 22, and/or the stabilizer 18 may have or include a cross-section that is circular, triangular, square, rectangular, hexagonal, polygonal, oval, or combinations thereof. The cross-sectional shapes of the vertical filament segments 20, the bridge 22, and the stabilizers 18 may be same (e.g., each cross-sectional shape may be square) or the cross-sectional shapes may be different. Initial values (i.e., pre-deposition process) for a cross-dimension (e.g., a diameter) within the cross-sectional shapes of the stabilizer 18, the vertical filament segments 20, and the bridge 22 are provided in Table 1. For example, the cross-dimension of the stabilizer 18, the vertical filament segments 20, and/or the bridge 22 may be from about 0.4 cm to about 2 cm, or preferably from about 0.7 cm to about 1 cm.

In general, the stabilizer 18 provides the filaments 16 with structural stability to prevent the filaments 16 from tipping over, thereby causing ground faults. For example, while the bridge 22 provides some structural stability to the vertical filament segments 20, the structural stability provided by the bridge 22 is generally in only one plane (e.g., the plane in which the U-shaped filament 16 resides). By adding the stabilizer 18, however, the filaments 16 are considerably stabilized in a direction perpendicular to that plane and/or in one or more other directions, while maintaining electrical isolation between the filaments 16, as desired. With the stabilizer 18 in place, stresses that might otherwise be concentrated at one chuck-to-filament connection are distributed to one or more other chuck-to-filament connections associated with the pair of filaments 16.

Connections between the vertical filament segments 20 and the horizontal bridge 22, and between the vertical filament segments 20 and corresponding chucks 14, are important for maintaining electrical connections in the CVD reactor 10. The chuck-to-filament connections may utilize, for example, a tapered fit, screws, bolts, clamps, and/or similar connectors. In general, the chuck-to-filament connections provide mechanical support to the vertical filament segments 20 and an electrical contact area or connection through which current may be passed, to provide resistive heating of the filaments 16. The vertical filament segments 20 and the bridge 22 may be connected using, for example, a groove or a key slot at the top of each vertical filament segment 20. A small counter bore can be formed on the ends of the bridge 22 so that the bridge 22 may be press fitted into the groove to connect the two vertical filament segments 20.

In certain embodiments, the chucks 14 include filament channels or sockets configured and sized to receive the vertical filament segments 20. The filament channels may have a cross-sectional geometry that corresponds with a cross-sectional configuration of the vertical filament segments 20. Further embodiments may involve filament channels having a tapered region that is sized to provide an interference fit with the vertical filament segments 20.

In typical service, the filaments 16 are electrically connected to one or more electrical power sources through the chucks 14. One or more precursor compounds are delivered to the reactor 10 through one or more inlets in the reactor. An electrical current is passed through the filaments 16 which generates heat and raises the temperature of the filaments 16 to a desired reaction temperature. The desired reaction temperature can be a temperature or a temperature range that favors semiconductor material production, such as polycrystalline silicon deposition. Unreacted precursor compounds and byproduct compounds can be removed from the reactor 10 through one or more outlet ports in the reactor 10. The chemical vapor deposition process may be performed until a desired amount of semiconductor material has been grown or produced as semiconductor rods.

The chucks 14 may include or consist essentially of carbon (e.g., graphite), silicon, or other suitable materials. Preferably, the chucks 14 are fabricated from carbon-containing compounds. Exemplary chucks are described in U.S. Patent Application Publication No. 2012/0171845, the disclosure of which is hereby incorporated by reference herein in its entirety.

Figure 2:
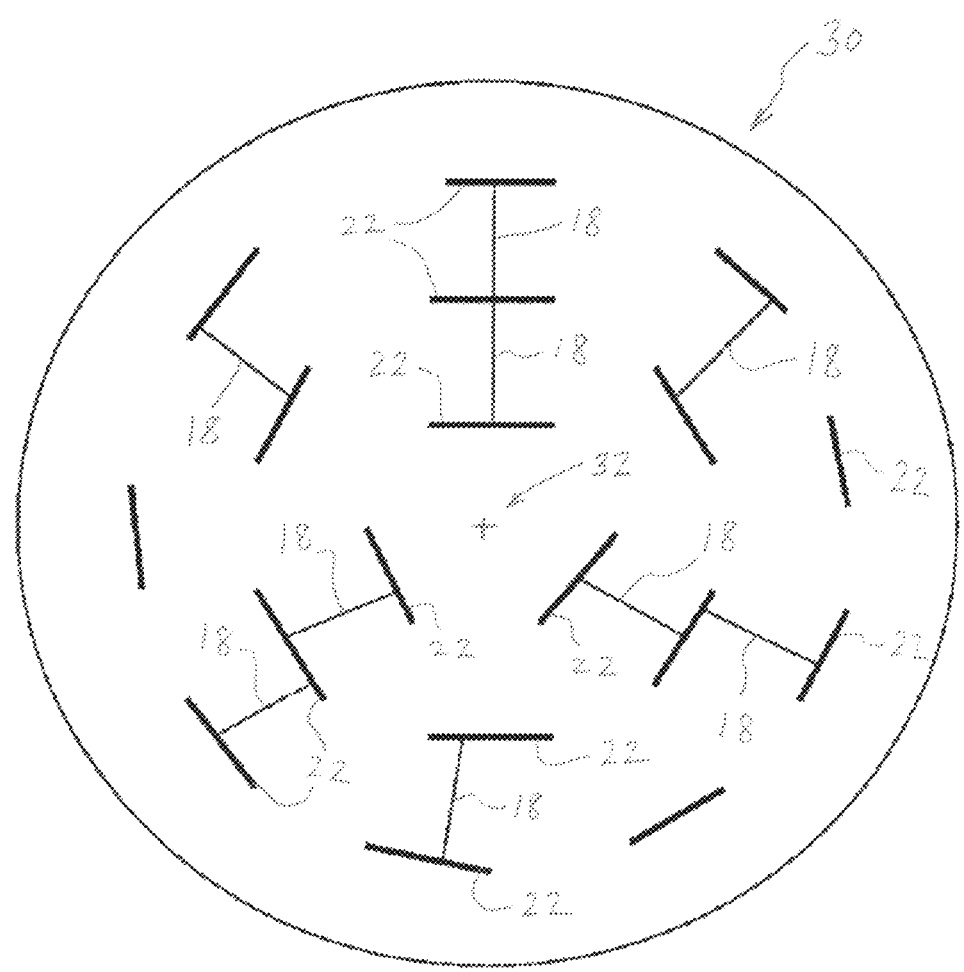
FIG. 2 is a schematic top view of a CVD reactor having an arrangement of filaments connected with stabilizers, according to illustrative embodiments of the invention.

Referring to the top view of a CVD reactor 30 in FIG. 2, in certain embodiments, the stabilizer 18 is substantially orthogonal or perpendicular to one or both or the bridges 22. For example, as depicted, each stabilizer 18 in the reactor 30 may be oriented substantially toward a center 32 of the reactor 30 (e.g., along a radial line), while the bridges 22 may be oriented substantially in a circumferential direction around the center 32, to form one or more rings. The lengths of the stabilizers 18 generally depend on the distances between the rings and the locations of the vertical filament segments 20. In some embodiments, the orientations of the stabilizers 18 and the bridges 22 are reversed, such that the bridges 22 are oriented toward the center 32 (i.e., along the radial lines) and the stabilizers 18 are oriented in the circumferential direction (i.e., in the rings). Alternatively, the one or more stabilizers 18 and the bridges 22 may not be oriented with respect to the center 32 and/or the circumferential direction of the reactor 30. Any arrangement and/or orientation of the stabilizers 18 and bridges 22 within the reactor may be utilized. As depicted, in some instances, more than two filaments 16 are connected together using more than one stabilizer 18. For example, three filaments 16 may be connected using two stabilizers 18. Connecting more than two filaments 16 together may result in improved stabilization of the filaments 16.

While the stabilizer 18 is preferably a straight structure for connecting two filaments 16 together, in some instances the stabilizer 18 is not straight and/or includes one or more branches to connect more than two filaments 16. For example, the stabilizer 18 may be Y-shaped or T-shaped (i.e., with three ends) to connect three filaments 16 together. The stabilizer 18 may also be X-shaped (i.e., with four ends), for example, to connect four filaments 16 together. In general, the stabilizer 18 may have any number of branches to connect multiple filaments 16 together, in any arrangement.

Figure 3:
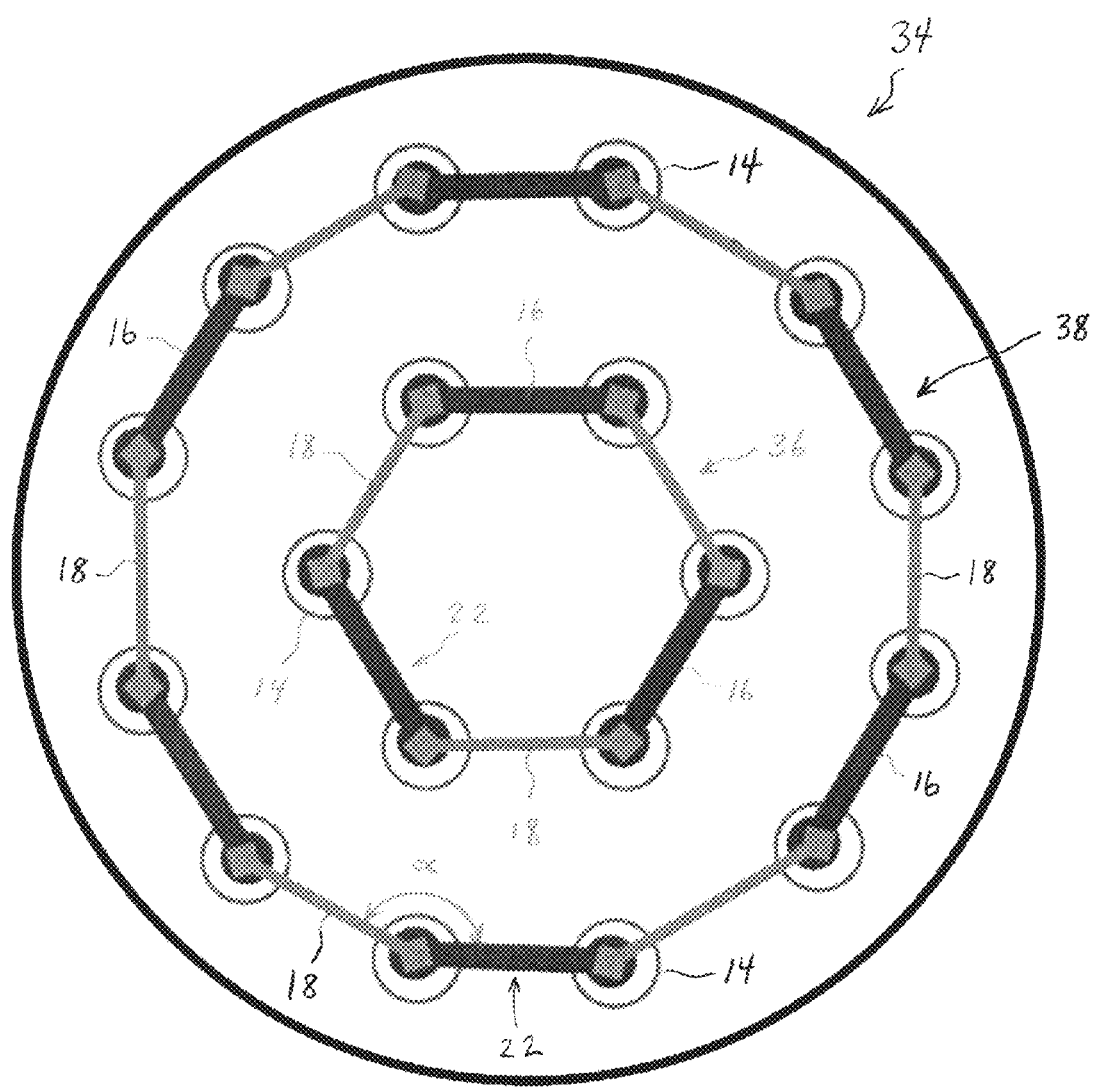
FIG. 3 is a schematic top view of a CVD reactor in which filaments and stabilizers are arranged in inner and outer rings, according to illustrative embodiments of the invention.

In certain embodiments, a plurality of filaments 16 are connected to chucks 14 arranged along one or more rings of a CVD reactor. In such instances, a plurality of stabilizers 18 may be used to connect some or all of the filaments 16 within one or more of these rings. For example, in the embodiment depicted in FIG. 3, a CVD reactor 34 includes an inner ring 36 having three filaments 16 and an outer ring 38 having six filaments 16. To stabilize the filaments 16 within each ring 36, 38, a stabilizer 18 is positioned between each adjacent pair of filaments 16 within the rings 36, 38. As depicted, connecting each pair of filaments 16 requires three stabilizers 18 in the inner ring 36 and six stabilizers 18 in the outer ring 38. Unlike the configuration depicted in FIGS. 1 and 2, where the stabilizers 18 are substantially orthogonal to the horizontal bridges 22 of the filaments 16, the stabilizers 18 shown in FIG. 3 may not be substantially orthogonal to the horizontal bridges 22 of the filaments 16.

Advantageously, by connecting the filaments 16 with the stabilizers 18 to complete the inner and outer rings 36, 38, the risk of filament breakage or tip-over may be greatly reduced. In alternative embodiments, the filaments 16 are stabilized by forming only partial rings with the stabilizers 18. For example, the filaments 16 in the outer ring 38 may be adequately stabilized when one or more stabilizers 18 are missing from the outer ring 38. In one example, a partial ring includes at least two filaments 16 and at least one stabilizer 18.

In general, when viewed from above, a stabilizer 18 and a bridge 22 may form a stabilizer angle $\alpha$. Depending on the arrangement of the filaments 16, the stabilizer angle $\alpha$ may have any value that provides the desired stabilization of the filaments 16. For example, the stabilizer angle $\alpha$ may be selected from a range of about 0 degrees to about 180 degrees, from about 20 degrees to about 160 degrees, from about 45 degrees to about 135 degrees, or from about 80 degrees to about 100 degrees. In some implementations, maximum stability may be achieved when the stabilizer angle $\alpha$ is about 90 degrees.

Figure 4:
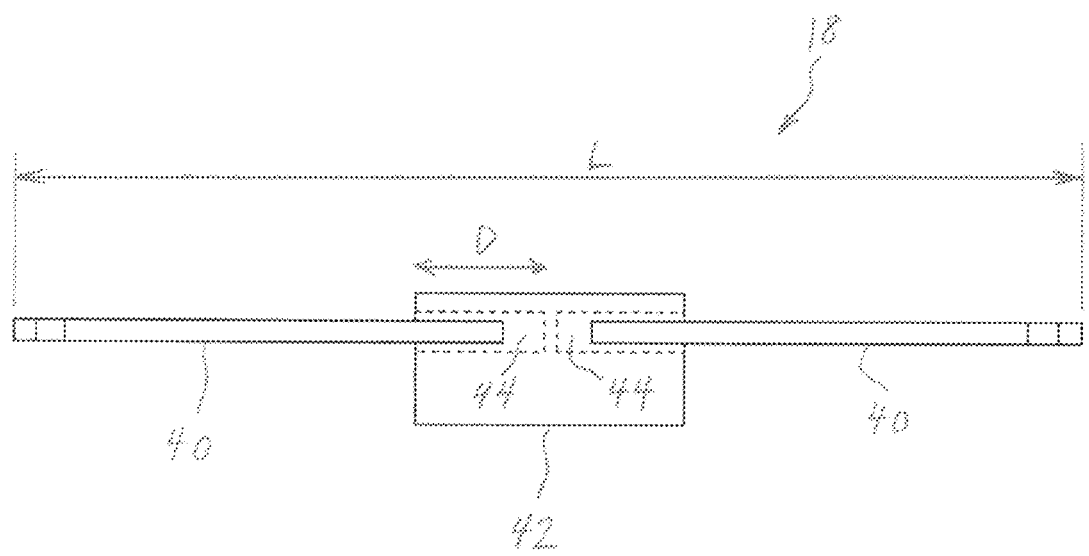
FIG. 4 is a schematic side view of a stabilizer having two support rods and a central connector, according to illustrative embodiments of the invention.

Referring to FIG. 4, in various embodiments, the stabilizer 18 includes two outer support rods 40 and a central connector 42. The central connector 42 includes two sockets 44, one socket 44 on each end, for receiving the support rods 40. Each socket 44 may have a depth D of about, for example, one-third to about one-half of a length of the support rods 40. A length L of the stabilizer 18 may be varied by adjusting a depth of insertion of the support rods 40 into the sockets 44. Alternatively, the stabilizer 18 may include a single support rod 40 and a single connector 42 with one socket 44 for receiving the support rod 40. When the stabilizer 18 includes additional branches for connecting more than two filaments 16, as described above, the connector 42 may include more than two sockets 44 for receiving the additional branches, as needed.

In general, the stabilizer 18 is or includes an electrically insulating material that prevents electricity from flowing through the stabilizer 18, during operation of the CVD reactor, including at high temperatures (e.g., at or near 1000° C.). For example, the stabilizer 18 may consist of or consist essentially of the electrically insulating material. Alternatively, the electrically insulating material may occupy or define only a portion of the stabilizer 18. In one embodiment, the electrically insulating material is located in the connector 42. For example, the entire connector 42 may include or consist essentially of an electrically insulating material. The electrically insulating material may be, for example, marble, silicon nitride, mica, quartz, silicon carbide, slate, porcelain, pyrophyllite, steatite, titanates, diamond, glass (e.g., soda-lime, borosilicate, and/or plate), and/or a polymer. A preferred insulating material is quartz. In certain embodiments, the support rods 40 are made of one or more electrically conducting materials (e.g., silicon), and the connector 42 is made of one or more electrically insulating materials (e.g., quartz). Using silicon as the material for the support rods may minimize the likelihood of contamination in CVD processes for the production of polysilicon. The insulating material is preferably a material that is stable at high temperatures (e.g., 1000° C.), does not contaminate the product, and is not electrically conductive. Silicon nitride and quartz are among many candidates for this purpose.

Figure 5:
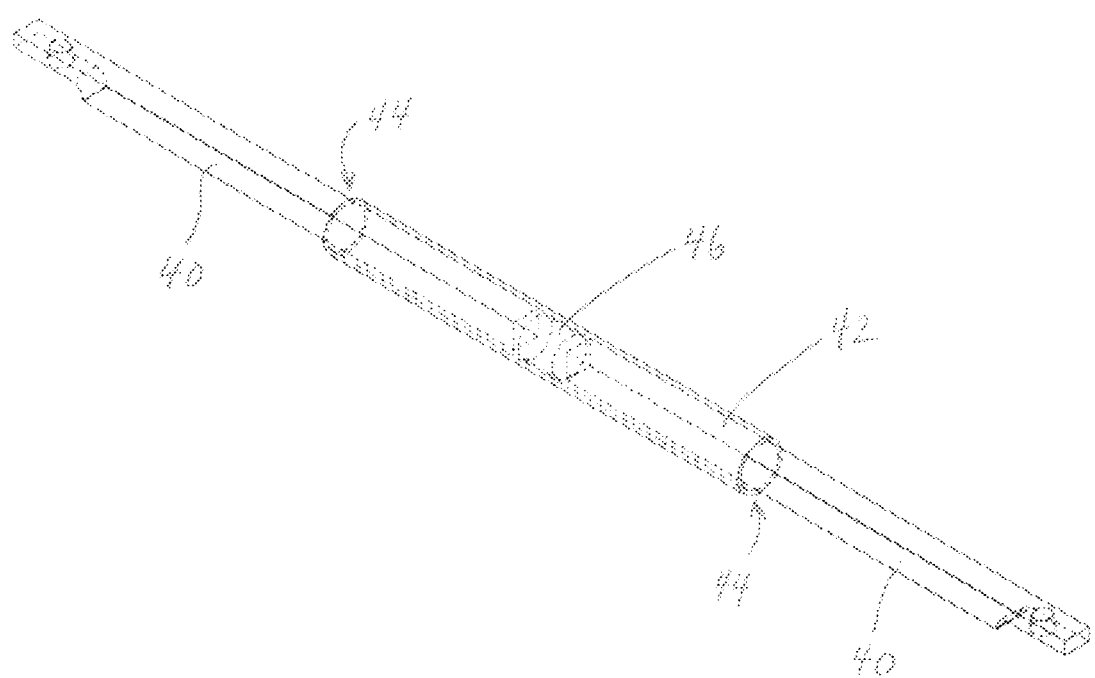
FIG. 5 is a schematic perspective view of a stabilizer having two support rods, a central connector, and an electrically insulating spacer, according to illustrative embodiments of the invention.

Referring to FIG. 5, in certain embodiments, the connector 42 is a tubular structure with open ends that act as the sockets 44 for receiving the support rods 40. As depicted, the connector 42 may have a circular cross-section and the support rods 40 may have a square cross-section. The connector 42 and the support rods 40 are preferably sized to achieve a friction or interference fit between the connector 42 and the support rods 40. In some embodiments, the connector 42 includes an electrically insulating spacer 46 to prevent direct contact between the support rods 40 upon insertion into the connector 42. The support rods 40 may include a small hole 48 on one end for securing the support rods 40 to the filaments 16, as described herein.

In some implementations, the stabilizer 18 does not include an electrically insulating material, such as an insulating connector 42. For example, the filaments 16 may be electrically isolated such that the stabilizer 18 does not need to prevent the flow of electricity between the two filaments 16. In such instances, the stabilizer 18 may be, for example, a silicon rod. Conveniently, the stabilizer 18 in such an instance may be made of the same material and/or have the same size and shape as the bridge 22. By forming the stabilizer 18 from the same material as the bridge 22, the risk of a foreign material contaminating the CVD process and/or product may be minimized.

To achieve electrical isolation between two filaments 16 connected by a stabilizer 18, electrical power may be supplied from independent sources such that the electrical potential across the stabilizer 18 (i.e., between the two filaments 16) is zero. In such instances, electricity may not flow through the stabilizer 18, even when the stabilizer 18 includes or consists essentially of electrically conductive materials. For example, when D/C current is applied to each filament 16, zero electrical potential across the stabilizer 18 may be achieved by applying voltage from different sources to the two filaments 16. Likewise, when A/C current is applied to each filament 16, zero electrical potential across the stabilizer 18 may be achieved by ensuring that the current is supplied from independent sources. In this way, using either D/C or A/C current, the voltage on each end of the stabilizer 18 may be identical (i.e., zero electrical potential across the stabilizer 18), such that no current flows through the stabilizer 18, even when the stabilizer 18 is electrically conductive. The voltage across the stabilizer 18 may equalize even when the voltages across the filaments 16 are different because the current may return to the source. Electrical isolation may be achieved by supplying each source through an independent transformer winding.

Figure 6:
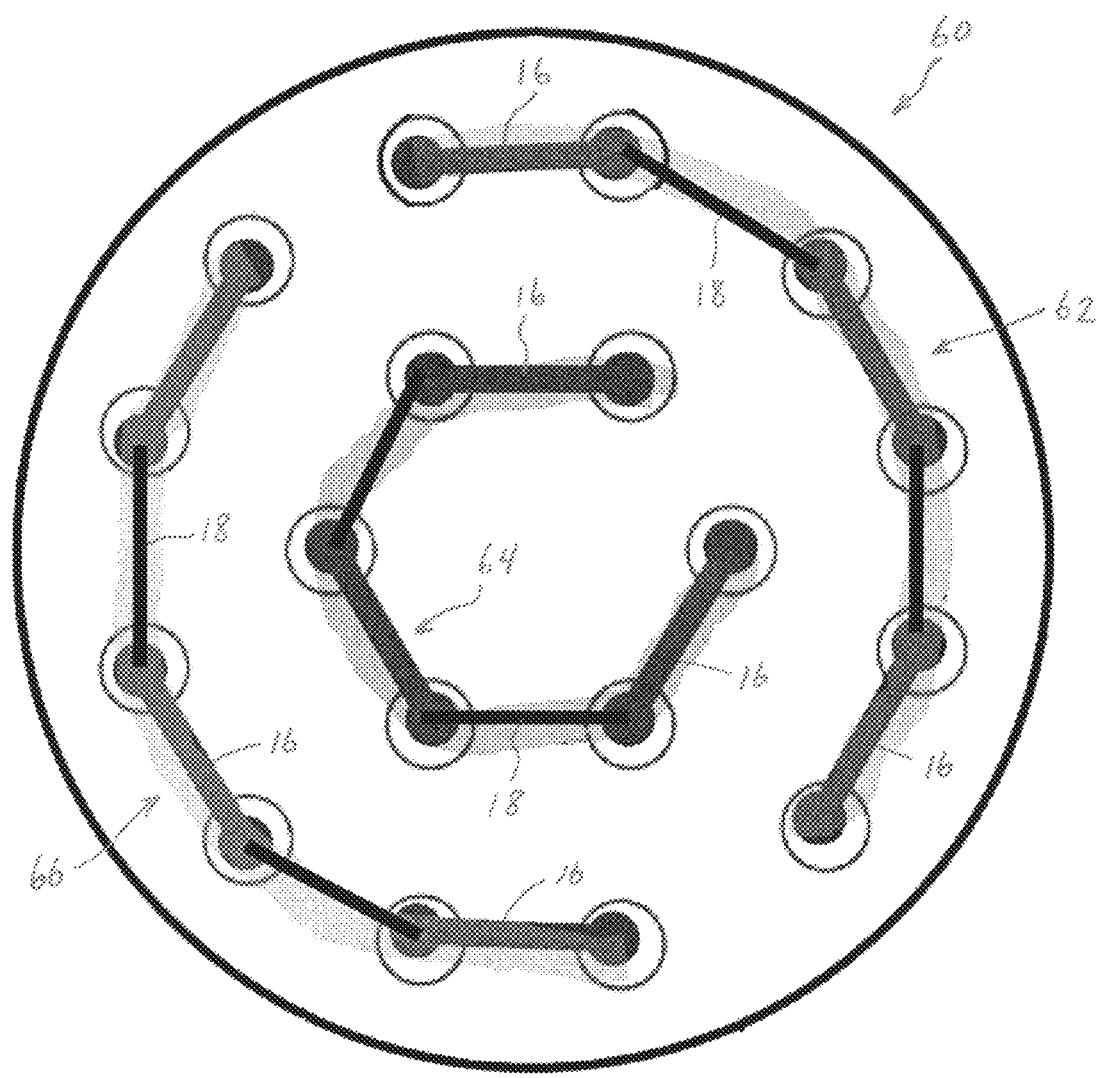
FIG. 6 is a schematic top view of a CVD reactor in which filaments and stabilizers are arranged in three separate groups for a three-phase electrical system, according to illustrative embodiments of the invention.

Referring to FIG. 6, in certain embodiments, a CVD reactor 60 utilizes a three-phase electrical system for three separate groups 62, 64, 66 of filaments 16, with each group 62, 64, 66 of filaments 16 receiving an A/C waveform having a different phase. By dedicating a different, single phase to each group 62, 64, 66, all of the filaments 16 within a group are electrically isolated from the other groups such that no current may flow through a stabilizer connected from one group to another. Individual groups 62, 64, 66 may be generally supplied with all of the filaments 16 in a group 62, 64, 66 in series with one another. Therefore, the current may flow from filament 16 to filament 16 within a group 62, 64, 66 and, by connecting conductive stabilizers 18 within a group 62, 64, 66, an alternate current path may be provided around some of the filaments 16. If different groups 62, 64, 66 are supplied from different, independent transformer phases, then the groups 62, 64, 66 may be electrically isolated, as described above. Accordingly, when there is only one connection between groups 62, 64, 66, current may not flow through the connection because the current may return to the transformer phase where it was initiated.

Figure 7:
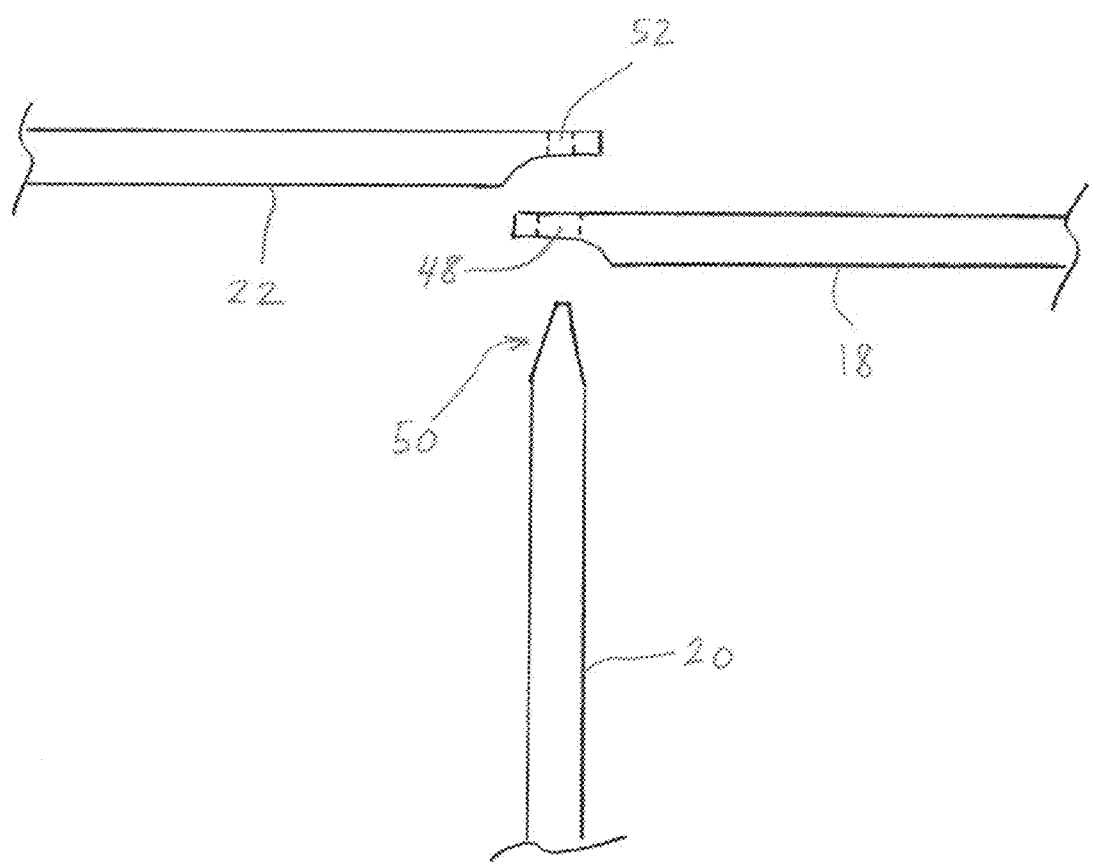
FIG. 7 is a schematic exploded view of a vertical filament segment, a stabilizer, and a bridge, according to illustrative embodiments of the invention.

The stabilizer 18 may be connected to the filaments 16 using any method and/or fixture that provide a mechanically stable connection, with little or no loosening or disconnecting. In some embodiments, the stabilizer 18 is fixed securely to the distal end of the filaments 16, at or near where the bridges 22 meet the vertical filament segments 20 (i.e., near the corner of the filaments 16). For example, the stabilizer 18 may be secured to the bridge 22 and/or the distal end of the vertical filament segments 20. Many methods may be used to secure the stabilizer 18 to the filaments 16, such as providing a notch on one or both ends of the stabilizer 18 to fit on or over the bridge 22. Pins, screws, or clamps may also be used to secure the stabilizer 18. Referring to FIG. 7, in one embodiment, the distal end of the vertical filament segments 20 are tapered to form a cone shape 50, and the cone shape 50 is inserted into the hole 48 in the stabilizer 18 and/or a hole 52 in the bridge 22. One or both of the holes 48, 52 may be tapered to provide a desirable fit with the cone shape 50.

In certain embodiments, a method of stabilizing filaments 16 in a CVD reactor includes providing a pair of filaments 16. The filaments 16 extend from the base plate 12 in the reactor that includes a plurality of electrical connections (e.g., located in a plurality of chucks 14). Each filament 16 is in electrical contact with, and defines a conductive path between, two of the electrical connections in the base plate 12. The method also includes connecting the filaments 16 with a stabilizer 18, as described above.

In some embodiments, a method of performing CVD in the CVD reactor includes passing electrical current through the filaments 16. The electrical current heats the filaments 16, through resistive heating, to a high temperature (e.g., greater than 800° C.). To heat the filaments 16, a voltage applied to the filaments 16 may be, for example, from about 500 V to about 50,000 V. Once the filaments 16 have reached the desired temperature, the voltage applied to the filaments 16 may be, for example, from about 5 V to about 500 V. The method also includes depositing polysilicon on the filaments 16.

In general, with little or no electrical current flowing through the stabilizer 18, much or all of the stabilizer 18 may not be hot enough for polysilicon deposition to occur. In some instances, most of the deposition on the stabilizer 18 occurs at or near the filaments 16, where the temperature of the stabilizer 18 may be high enough for deposition to occur (e.g., due to heat conduction from the filaments 16). Use of the stabilizer 18 does not generally hamper the harvesting of the filaments 16, once the deposition process has been completed.

In some embodiments, deposition on one or more portions of the stabilizer 18 may be problematic to the electrical supply. For example, deposition along an entire length of the stabilizer 18 may create a path for electricity to travel or conduct between the filaments 16. To minimize such problems, a safety mechanism may be modified to allow operation in this scenario. As mentioned, in some embodiments, the flow of electricity through the stabilizer 18 may be avoided by connecting the stabilizer across electrically isolated filaments 16.

EQUIVALENTS

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A chemical vapor deposition reactor system comprising:
    a base plate comprising a plurality of electrical connections;
    a pair of filaments extending from the base plate, each filament comprising two vertical filament segments and a bridge, each of the vertical segments comprising a proximal end in electrical contact with one of the electrical connections and a distal end in electrical contact with the bridge, so that the vertical segments and bridge of each filament defines a conductive path between respective electrical connections; and
    a stabilizer connecting the pair of filaments, said stabilizer comprising at least one electrically conductive support rod and at least one electrically insulating connector that prevents flow of electricity through the stabilizer during chemical vapor deposition.

2. The system of claim 1, wherein the electrically insulating connector comprises at least one socket for receiving the at least one electrically conductive support rod.

3. The system of claim 1, wherein the stabilizer comprises two outer electrically conductive support rods joined by a central electrically insulating connector.

4. The system of claim 3, wherein at least one of the outer electrically conductive support rods comprises silicon.

5. The system of claim 3, wherein the central electrically insulating connector comprises at least one of quartz or silicon nitride.

6. The system of claim 1, wherein the stabilizer is adjustable in length.

7. The system of claim 1, wherein the stabilizer is connected to the pair of filaments near the distal end of one of the vertical filament segments thereof.

8. The system of claim 1, wherein the stabilizer is connected to at least one of the filaments at the bridge.

9. The system of claim 1, wherein a stabilizer angle between the stabilizer and the bridge is selected from a range of about 20 degrees to about 160 degrees.

10. The system of claim 9, wherein the stabilizer angle is selected from a range of about 80 degrees to about 100 degrees.

11. The system of claim 1, wherein each filament is substantially U-shaped.

12. The system of claim 1, wherein the stabilizer and the pair of filaments are arranged to define at least one of a ring or a partial ring.

13. The system of claim 12, wherein the at least one ring or partial ring comprises more than two filaments and more than one stabilizer.

14. The system of claim 1, further comprising a second pair of filaments and a second stabilizer connecting the second pair of filaments, wherein the pair of filaments is configured to operate at a first electrical phase, and the second pair of filaments is configured to operate at a second electrical phase.

* * * * *